US012300963B2

(12) United States Patent
Okawachi et al.

(10) Patent No.: US 12,300,963 B2
(45) Date of Patent: May 13, 2025

(54) TUNABLE OPTICAL FREQUENCY COMB GENERATOR IN MICRORESONATORS (71) Applicant: The Trustees of Columbia University in the City of New York, New York, NY (US)

(72) Inventors: Yoshitomo Okawachi, River Edge, NJ (US); Jae Jang, New York, NY (US); Xingchen Ji, New York, NY (US); Michal Lipson, New York, NY (US); Alexander L. Gaeta, New York, NY (US); Bok Young Kim, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 706 days.

(21) Appl. No.: 17/400,813

(22) Filed: Aug. 12, 2021

(65) Prior Publication Data

US 2021/0373362 A1  Dec. 2, 2021

Related U.S. Application Data (63) Continuation of application No. PCT/US2020/017955, filed on Feb. 12, 2020.
(Continued)

(51) Int. Cl.
*H01S 5/00* (2006.01)
*G02F 1/015* (2006.01)
*G02F 1/21* (2006.01)

(52) U.S. Cl.
CPC .............. *H01S 5/005* (2013.01); *G02F 1/015* (2013.01); *G02F 1/212* (2021.01); *G02F 2203/15* (2013.01); *G02F 2203/56* (2013.01)

(58) Field of Classification Search
CPC .......... H01S 5/005; G02F 1/212; G02F 1/015; G02F 2203/15; G02F 2203/56
(Continued)

(56) References Cited

U.S. PATENT DOCUMENTS 6,078,605 A * 6/2000 Little ...................... G02F 1/011
372/100
6,201,638 B1 3/2001 Hall et al.
(Continued)

FOREIGN PATENT DOCUMENTS

EP 2763341 A1 * 8/2014 ........... H04B 10/506

OTHER PUBLICATIONS

V. E. Lobanov, G. Lihachev, T. J. Kippenberg, and M. L. Gorodetsky, "Frequency combs and platicons in optical microresonators with normal GVD," Opt. Express, vol. 23, Issue 6, pp. 7713-7721, (2015).
(Continued)

*Primary Examiner* — Sharrief I Broome
(74) *Attorney, Agent, or Firm* — BakerHostetler (57) ABSTRACT Optical frequency combs and related methods, devices, and systems are described. An example device can comprise a waveguide configured to optically couple to an optical source and at least one optical resonator optically coupled to the waveguide. The one or more of the at least one optical resonator can be tuned such that an optical frequency comb is generated based on mode interaction between two different modes of the at least one optical resonator. The device can comprise an output coupled to the waveguide and configured to output the optical frequency comb.

24 Claims, 5 Drawing Sheets

Related U.S. Application Data (60) Provisional application No. 62/804,613, filed on Feb. 12, 2019.

(58) Field of Classification Search
USPC .......................................................... 359/278
See application file for complete search history.

(56) References Cited

U.S. PATENT DOCUMENTS

| | | | |
|---|---|---|---|
| 7,062,131 | B2 | 6/2006 | Ilchenko |
| 7,420,994 | B2 | 9/2008 | Korolev et al. |
| 7,650,080 | B2* | 1/2010 | Yap ........................... G02F 2/02 398/186 |
| 8,750,717 | B1 | 6/2014 | Yap et al. |
| 9,625,351 | B2 | 4/2017 | Ataie et al. |
| 2003/0007522 | A1 | 1/2003 | Li et al. |
| 2004/0264977 | A1* | 12/2004 | Yap ........................... G02F 2/02 398/161 |
| 2006/0198397 | A1* | 9/2006 | Korolev .................. H01S 3/302 372/20 |
| 2008/0285606 | A1 | 11/2008 | Kippenberg et al. |
| 2009/0067843 | A1 | 3/2009 | Way et al. |
| 2009/0214223 | A1* | 8/2009 | Chen ....................... H04B 10/00 398/183 |
| 2009/0284828 | A1 | 11/2009 | Sosabowski et al. |
| 2011/0255871 | A1* | 10/2011 | Etemad ................. H04B 10/506 398/79 |
| 2012/0105177 | A1 | 5/2012 | McLaren et al. |
| 2012/0320448 | A1 | 12/2012 | Li et al. |
| 2014/0110572 | A1* | 4/2014 | Li ............................. G02F 1/025 250/227.23 |
| 2014/0192363 | A1 | 7/2014 | Kippenberg et al. |
| 2015/0030040 | A1* | 1/2015 | Zhou ......................... G02F 1/35 372/18 |
| 2015/0168803 | A1* | 6/2015 | Xu ...................... H04Q 11/0005 359/332 |
| 2016/0070062 | A1* | 3/2016 | Lipson ................... G02B 6/122 385/30 |
| 2016/0226216 | A1* | 8/2016 | Schilt .................... H01S 3/0092 |
| 2017/0346445 | A1* | 11/2017 | Shen ..................... H04J 14/028 |

OTHER PUBLICATIONS

W. Liang, A. A. Savchenkov, V. S. Ilchenko, D. Eliyahu, D. Seidel, A. B. Matsko, and L. Maleki, "Generation of a coherent near-infrared Kerr frequency comb in a monolithic microresonator with normal GVD," Opt. Lett, vol. 39, Issue 10, 2014, pp. 2920-2923.
X. Xue, Y. Xuan, P.-H. Wang, Y. Liu, D. E. Leaird, M. Qi, and A. M. Weiner, "Normal-dispersion microcombs enabled by controllable mode interactions," Laser Phot. Rev, vol. 9,pp. L23-L27, (2015).
Xue et al., "Mode-locked dark pulse Kerr combs in normal-dispersion microresonators," Nat. Photonics, vol. 9, (2015), pp. 594-600.
Y. Chembo, and N. Yu, "Modal expansion approach to optical-frequency-comb generation with monolithic whispering-gallery-mode resonators," Phys. Rev. A, vol. 82, 033801, (2010).
Y. K. Chembo, and C. R. Menyuk, "Spatiotemporal Lugiato-Lefever formalism for Kerr-comb generation in whispering-gallery-mode resonators," Phys. Rev. A, vol. 87, 053852, (2013).
Y. Liu, Y. Xuan, X. Xue, P.-H. Wang, S. Chen, A. J. Metcalf, J. Wang, D. E. Leaird, M. Qi, and A. M. Weiner, "Investigation of mode coupling in normal-dispersion silicon nitride microresonators for Kerr frequency comb generation," Optica, vol. 1, Issue 3, pp. 137-144, (2014).
Yi et al., "Soliton frequency comb at microwave rates in a high-Q silica microresonator," Optica., vol. 2, (2015), pp. 1078-1085.
A. A. Savchenkov, A. B. Matsko, V. S. Ilchenko, I. Solomatine, D. Seidel, and L. Maleki, "Tunable optical frequency comb with a crystalline whispering gallery mode resonator," Phys. Rev. Lett, vol. 101, pp. 093902-093905, (2008).

A. A. Savchenkov, A. B. Matsko, W. Liang, V. S. Ilchenko, D. Seidel, and L. Maleki, "Kerr frequency comb generation in overmoded resonators," Opt. Express, vol. 20, Issue 24, (2012), pp. 27290-27298.
A. B. Matsko, W. Liang, A. A. Savchenkov, D. Eliyahu, and L. Maleki, "Optical Cherenkov radiation in overmoded microresonators," Opt. Lett, vol. 41, Issue 13, pp. 2907-2910, (2016).
A. Fülöp, et al., "Active feedback stabilization of normal-dispersion microresonator combs," in 2017 European Conference on Lasers and Electro-Optics and European Quantum Electronics Conference, Optical Society of America, 2017, pp. 1-1.
A. Fülöp, et al., "Higher-order coherent communications using mode-locked dark-pulse Kerr combs from microresonators," Nature Commun, vol. 9, pp. 1598-1605, (2018).
A. M. Pérez, C. Santiago, and F. R. C. Zuñiga, "Optical properties of amorphous hydrogenated silicon nitride thin films," Opt. Eng, vol. 45, Issue 12,123802, (2006).
B. Stern, X. Ji, Y. Okawachi, A. L. Gaeta, and M. Lipson, "Battery-operated integrated frequency comb generator," Nature, vol. 562, pp. 401-405, (2018).
Brasch et al., "Photonic chip-based optical frequency comb using soliton Cherenkov radiation," Science, vol. 351, (2016), pp. 357-360.
C. Milián, and D. V. Skryabin, "Soliton families and resonant radiation in a micro-ring resonator near zero groupvelocity dispersion," Opt. Express, vol. 22, Issue 3, pp. 3732-3739, (2014).
Coen et al., "Modeling of octave-spanning Kerr frequency combs using a generalized mean-field Lugiato Lefever model," Opt. Lett., vol. 38, (2013), pp. 37-39.
F. Leo, S. Coen, P. Kockaert, S.-P. Gorza, Ph. Emplit, and M. Haelterman, "Temporal cavity solitons in onedimensional Kerr media as bits in an all-optical buffer," Nature Photon, vol. 4, pp. 471-476, (2010).
Ferdous et al., "Spectral line-by-line pulse shaping of on-chip microresonator frequency combs," Nat. Photonics, vol. 5, (2011), pp. 770-776.
Griffith et al., "Silicon-chip mid-infrared frequency comb generation," Nat. Commun., vol. 6, (2015), 6299.
H. Zhou, S.-W. Huang, Y. Dong, M. Liao, K. Qiu, and C.W.Wong, "Stability and intrinsic fluctuations of dissipative cavity solitons in Kerr frequency microcombs," IEEE Photon. J, vol. 7, 3200113, (2015).
Hausmann et al., "Diamond nonlinear photonics," Nat. Photonics, vol. 8, (2014), pp. 369-374.
Herr et al., "Mode Spectrum and Temporal Soliton Formation in Optical Microresonators," Phys. Rev. Lett., vol. 113, 2014. pp. 1-6.
Herr et al., "Temporal solitons in optical microresonators," Nat. Photonics, vol. 8, (2014), pp. 145-152.
I. H. Agha, Y. Okawachi, and A. L. Gaeta, "Theoretical and experimental investigation of broadband cascaded four-wave mixing in high-Q microspheres," Opt. Express, vol. 17, Issue 18, pp. 16209-16215 (2009).
J. C. Hulme, J. K. Doylend, and J. E. Bowers, "Widely tunable Vernier ring laser on hybrid silicon," Opt. Express, vol. 21, Issue 17, pp. 19718-19722, (2013).
J. K. Jang, M. Erkintalo, S. G. Murdoch, and S. Coen, "Observation of dispersive wave emission by temporal cavity solitons," Opt. Lett, vol. 39, pp. 5503-5506, (2014).
J. K. Jang, Y. Okawachi, M. Yu, K. Luke, X. Ji, M. Lipson, and A. L. Gaeta, "Dynamics of mode-coupling-induced microresonator frequency combs in normal dispersion," Opt. Express, vol. 24, Issue 25, pp. 28794-28803, (2016).
Joshi et al., "Thermally controlled comb generation and soliton modelocking in microresonators," Opt. Lett., vol. 41, 2016, pp. 2565-2568.
Jung et al., "Optical frequency comb generation from aluminum nitride microring resonator," Opt. Lett., vol. 38, (2013), pp. 2810-2813.
K. E. Webb, J. K. Jang, J. Anthony, S. Coen, M. Erkintalo, and S. G. Murdoch, "Measurement of microresonator frequency comb coherence by spectral interferometry," Opt. Lett., vol. 41, Issue 2, pp. 277-280, (2016).

(56) References Cited

OTHER PUBLICATIONS

Kippenberg et al., "Microresonator-based optical frequency combs," Science, vol. 332, 2011, pp. 555-559.

L. Lugiato, and R. Lefever, "Spatial dissipative structures in passive optical systems," Phys. Rev. Lett. Vol. 58, pp. 2209-2211, (1987).

Lamont et al., "Route to stabilized ultrabroadband microresonator-based frequency combs," Opt. Lett., vol. 38, (2013), pp. 3478-3481.

Levy et al., "CMOS-compatible multiple-wavelength oscillator for on-chip optical interconnects," Nat. Photonics, vol. 4, (2010), pp. 37-40.

M. A. Foster, J. S. Levy, O. Kuzucu, K. Saha, M. Lipson, and A. L. Gaeta, "Silicon-based monolithic optical frequency comb source," Opt. Express, vol. 19, Issue 15, pp. 14233-14239 (2011).

M. Haelterman, S. Trillo, and S. Wabnitz, "Dissipative modulation instability in a nonlinear dispersive ring cavity,"Opt. Commun, vol. 91, pp. 401-407, (1992).

Marin-Palomo et al., "Microresonator-based solitons for massively parallel coherent optical communications," Nature, vol. 546, (2017), pp. 274-279.

N. N. Rozanov, V. E. Semenov, and G. V. Khodova, "Transverse structure of a field in nonlinear bistable interferometers. I. Switching waves and steady-state profiles," Sov. J. Quantum Electron, vol. 12, pp. 193-197, (1982).

P. Del'Haye, A. Schliesser, O. Arcizet, T. Wilken, R. Holzwarth, and T. J. Kippenberg, "Optical frequency comb generation from a monolithic microresonator," Nature, vol. 450, pp. 1214-1217, (2007).

P. Parra-Rivas, D. Gomila, E. Knoblogh, S. Coen, and L. Gelens, "Origin and stability of dark pulse Kerr combs normal dispersion resonators," Opt. Lett, vol. 41, Issue 11, pp. 2402-2405, (2016).

P.-H. Wang, J. A. Jaramillo-Villegas, Y. Xuan, X. Xue, C. Bao, D. E. Leaird, M. Qi, and A. M. Weiner, "Intracavity characterization of micro-comb generation in the single-soliton regime," Opt. Express, vol. 24, pp. 10890-10897, 2016.

Pfeifle J, Brasch V, Freude W, Leuthold J, Kippenberg TJ, Koos C, "Coherent terabit communications with microresonator Kerr frequency combs," Nature Photonics, vol. 8, Apr. 2014, pp. 375-380.

Q.-F. Yang, X. Yi, K. Y. Yang, and K. Vahala, "Spatial-mode-interaction-induced dispersive-waves and their active tuning in microresonators," Optica, vol. 3, Issue 10, pp. 1132-1135, 2016.

Razzari et al., "CMOS-compatible integrated optical hyper-parametric oscillator," Nat. Photonics, vol. 4, (2010), pp. 41-45.

S. A. Miller, Y. Okawachi, S. Ramelow, K. Luke, A. Dutt, A. Farsi, Alexander L. Gaeta, and M. Lipson, "Tunable frequency combs based on dual microring resonators," Opt. Express, vol. 23, Issue 16, pp. 21527-21540, (2015).

S. Coen, and M. Erkintalo, "Universal scaling laws of Kerr frequency combs," Opt. Lett, vol. 38, pp. 1790-1792, (2013).

S. Coen, and M. Haelterman, "Modulational instability induced by cavity boundary conditions in a normally dispersive optical fiber," Phys. Rev. Lett, vol. 79, pp. 4139-4142, (1997).

S. Coen, M. Tlidi, Ph. Emplit, and M. Haelterman, "Convection versus dispersion in optical bistability," Phys. Rev. Lett, vol. 83, pp. 2328-2331, (1999).

S. Ramelow, A. Farsi, S. Clemmen, J. S. Levy, A. R. Johnson, Y. Okawachi, M. R. E. Lamont, M. Lipson, and A. L. Gaeta, "Strong polarization mode coupling in microresonators," Opt. Lett, vol. 39, Issue 17, pp. 5134-5137 (2014).

S.-W. Huang, J. Yang, J. Lim, H. Zhou, M. Yu, D.-L. Kwong, and C. W. Wong, "A low-phase-noise 18 GHz Kerr frequency microcomb phase-locked over 65 THz," Sci. Rep, vol. 5, pp. 13355-13561 (2015).

Saha et al., "Modelocking and femtosecond pulse generation in chip-based frequency combs," Opt. Express, vol. 21, (2013), pp. 1335-1343.

Stern et al., "Compact narrow-linewidth integrated laser based on a low-loss silicon nitride ring resonator," Opt. Lett., vol. 42, (2017), pp. 4541-4544.

T. Carmon, H. G. L. Schwefel, L. Yang, M. Oxborrow, A. D. Stone, and K. J. Vahala, "Static envelope patterns in composite resonances generated by level crossing in optical toroidal microcavities," Phys. Rev. Lett, vol. 100, 103905, (2008).

T. Carmon, L. Yang, and K. J. Vahala, "Dynamical thermal behavior and thermal self-stability of microcavities," Opt. Express, vol. 12, Issue 20, pp. 4742-4750, (2004).

T. Hansson, D. Modotto, and S. Wabnitz, "Dynamics of the modulational instability in microresonator frequency combs," Phys. Rev. A, vol. 88, 023819, (2013).

T. J. Kippenberg, A. L. Gaeta, M. Lipson, M. L. Gorodetsky, "Dissipative Kerr solitons in optical microresonators," Science, vol. 361, Issue. 6402, (2018), pp. 567-578.

* cited by examiner

TUNABLE OPTICAL FREQUENCY COMB GENERATOR IN MICRORESONATORS

CROSS-REFERENCE TO RELATED APPLICATIONS

This application is a continuation of International Application PCT/US2020/017955, filed Feb. 12, 2020, which claims priority to and the benefit of United States Patent Application No. 62/804,613, "Tunable Optical Frequency Comb Generator In Microresonators" (filed Feb. 12, 2019), each of which is hereby incorporated by reference in its entirety for any and all purposes.

GOVERNMENT RIGHTS

This invention was made with government support under Contract No. DE-AR0000843 awarded by the Department of Energy. The government has certain rights in the invention.

BACKGROUND

Existing frequency combs can exhibit certain disadvantages, including low power efficiency. Accordingly, there is a long-felt need in the art for improved frequency combs and related methods.

SUMMARY

The present disclosure provides, inter alia, devices that enable the generation of an optical frequency comb from a single-frequency continuous-wave pump laser. The device can generate multiple wavelength channels with high conversion efficiency. Comb generation can occur via parametic oscillation through a nonlinear optical process of parametric four-wave mixing (FWM) in a high-finesse microcavity.

Traditionally, comb generation may be limited to the anomalous group velocity dispersion (GVD) of the micro-resonator, which allows for an efficient phase-matched nonlinear optical process of FWM. Under suitable conditions, a soliton pulse can be generated within the cavity which results in a low-noise, modelocked frequency comb and the bandwidth is determined by the dispersion of the material and is not readily tunable after fabrication of the device.

Provided herein are devices, methods, and systems configured to cause comb formation in the normal GVD regime. Using the disclosed techniques, comb formation can be enabled through the use of a mode interaction between two different modes of the resonator. These mode interactions can be between different spatial modes, different polarization modes, modes of two different resonators that are coupled, a combination thereof, and/or the like. Unlike the soliton case, bandwidth can be controlled through control of the coupling strength (see e.g., Jang, et al., "Dynamics of mode-coupling induced micro-resonator frequency combs in normal dispersion," Opt. Express 24, 28794 (2016), incorporated herein by reference in its entirety for all purposes). This approach allows for comb formation to be achieved in the normal-GVD regime, which is more readily accessible in most photonic materials. In addition, unlike the soliton-modelocked comb, high power conversion efficiency can be achieved (i.e., >40%) by the disclosed technology.

Mode interactions for comb generation using spatial modes or polarization modes are typically not tunable because the mode interactions depend on intrinsic resonator properties. The disclosed technique can comprise a coupled-resonator system that utilizes the same waveguide spatial mode in two different micro-resonators.

The coupling strength between the two different cavities, along with the GVD of the micro-resonator can determine the bandwidth of the generated comb. Control over this coupling strength allows for tuning of the overall generated comb bandwidth, allowing for flexibility in the generation 10's of comb lines to greater than 100 lines.

The coupling strength between the two different cavities can be controlled by adjusting a distance of an interaction between two resonators, by implementing a Mach-Zehnder interferometer between the resonators (e.g., allowing for dynamic tuning), a combination thereof, and/or the like. In addition, the wavelength at which the interaction occurs can be tuned by adjusting the spectral position of the resonance.

This spectral tuning can be performed through thermal tuning of one or both of the micro-resonators. Thermal tuning may be performed using integrated heaters, electrical tuning, or a combination thereof. Electrical tuning may be performed (e.g., by free-carriers) using a PIN junction in indirect bandgap materials, such as silicon, germanium, a combination thereof, and/or the like. Electrical tuning may be performed using electro-optic materials, such as lithium niobate, lithium tantalate, a combination thereof, and/or the like. Thermal tuning can be compatible with various photonics platforms, such as silicon, silicon nitride, aluminum nitride, lithium niobate, germanium, diamond, silicon carbide, silicon dioxide and other glasses, amorphous silicon, silicon-on-sapphire, a combination thereof, and/or the like.

Tuning of the resonance with respect to the pump source position can allow for shaping the overall comb spectrum and/or power in the generated comb lines. By tuning the coupling strength between the coupled-resonator system and the coupling or bus waveguide which carries the pump wave, control of both the bandwidth and the pump-to-comb conversion efficiency can be achieved. In one example integrated structure, this can be performed by implementing a second Mach-Zehnder interferometer between the resonator between the ring and the coupling waveguide. This tunable coupling can also be implemented in nonintegrated systems, such as whispering gallery mode resonators in which a tapered fiber or prism coupling is used.

The disclosed technology can comprise a bandwidth tunable multiple wavelength optical source. The optical source can have flexibility in the spacing between the wavelength channels from GHz to THz scale that is based on the micro-resonator cavity length. By using an integrated micro-resonator, the control of the spectral position of the resonance along with the ability to engineer the dispersion of the system in turn allows for complete control of the operating wavelength, comb line spacing, and bandwidth. Furthermore, by interfacing with compact optical pump sources, a portable, integrated high efficiency, a high power comb source is enabled.

In meeting the described long-felt needs, the present disclosure first provides devices, comprising: a waveguide configured to optically couple to an optical source; at least one optical resonator optically coupled to the waveguide, wherein one or more of the at least one optical resonator is tuned such that an optical frequency comb is generated based on mode interaction between two different modes of the at least one optical resonator; and an output coupled to the waveguide and configured to output the optical frequency comb.

Also provided are methods, comprising: supplying an optical source (e.g., light source) to at least one optical resonator; tuning the at least one optical resonator to cause output of an optical frequency comb, wherein the optical frequency comb is generated based on mode interaction between two different modes of the at least one optical resonator; and outputting the optical frequency comb.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various aspects discussed in the present document. In the drawings.

DETAILED DESCRIPTION OF ILLUSTRATIVE EMBODIMENTS

The present disclosure may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention.

Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable, and it should be understood that steps may be performed in any order.

Throughout this document, values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range. The statement "about X to Y" has the same meaning as "about X to about Y," unless indicated otherwise. Likewise, the statement "about X, Y, or about Z" has the same meaning as "about X, about Y, or about Z," unless indicated otherwise. The term "about" as used herein can allow for a degree of variability in a value or range, for example, within 10%, within 5%, or within 1% of a stated value or of a stated limit of a range, and includes the exact stated value or range. The term "substantially" as used herein refers to a majority of, or mostly, as in at least about 50%, 60%, 70%, 80%, 90%, 95%, 96%, 97%, 98%, 99%, 99.5%, 99.9%, 99.99%, or at least about 99.999% or more, or 100%. While "about" permits some tolerance, a person of ordinary skill in the art would read the specification in light of his knowledge and skill for guidance on the level of that tolerance, and be reasonably apprised to a reasonable degree the metes and bounds of the claims.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. All documents cited herein are incorporated herein in their entireties for any and all purposes.

Further, reference to values stated in ranges include each and every value within that range. In addition, the term "comprising" should be understood as having its standard, open-ended meaning, but also as encompassing "consisting" as well. For example, a device that comprises Part A and Part B may include parts in addition to Part A and Part B, but may also be formed only from Part A and Part B. Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes. "Optional" or "optionally" means that the subsequently described event or circumstance may or may not occur, and that the description includes instances where said event or circumstance occurs and instances where it does not.

Recent developments of micro-resonator-chip-based frequency combs offer the prospect of generating many single-frequency components that are evenly spaced to ultrahigh precision. Such a source is ideal for wavelength-division multiplexing (WDM) applications since the spacing of all the frequency components can be fixed to a specified frequency grid simply by stabilizing the micro-resonator, which can be done at low powers with a microheater. Such an approach is in contrast to using an equal number of single-frequency laser sources in which each laser must be stabilized to maintain its frequency on the grid, which adds substantial complexity and required power.

A typical objective of a comb generation process for WDM applications is to prioritize the comb having low noise and being stabilized such that spacing between the lines is equidistant. Conventionally, this objective has been achieved by exciting soliton modelocked combs in the anomalous group-velocity dispersion (GVD) regime with the potential for aggregate transmission rates of 50 Tb/s. A serious challenge of using such soliton-modelocked combs for photonic interconnects, however, is the low power efficiency due to 1) inherent weak (i.e., 0.5-3%) conversion of the pump power to the comb to excite the fundamental soliton and 2) the spectrum and therefore the power in each comb line falls off exponentially [i.e., $\text{sech}^2(w)$] from the center portion of the comb.

These limitations of soliton-modelocked combs can be overcome with a WDM source based on frequency comb generation in the normal-GVD regime as disclosed herein. The disclosed frequency combs can be low noise, offer much higher conversion efficiencies (e.g., greater than 40%) from the pump laser to the comb, and have significantly better uniformity in the power of the comb lines. Generation of such combs in the normal group-velocity dispersion (GVD) is possible by pumping near a mode-crossing that distorts the dispersion for the pump field. Mode-crossings occur when coupling between two distinct resonator modes that are frequency-degenerate results in the alteration of the shape and position of the resonances. This is accompanied by a localized change in the dispersion of the resonator near the crossing and allows for phase matching to enable efficient four-wave mixing interactions for comb generation, and mode-interaction-assisted comb generation due to coupling between two different spatial modes has been demonstrated.

Figure 1A:
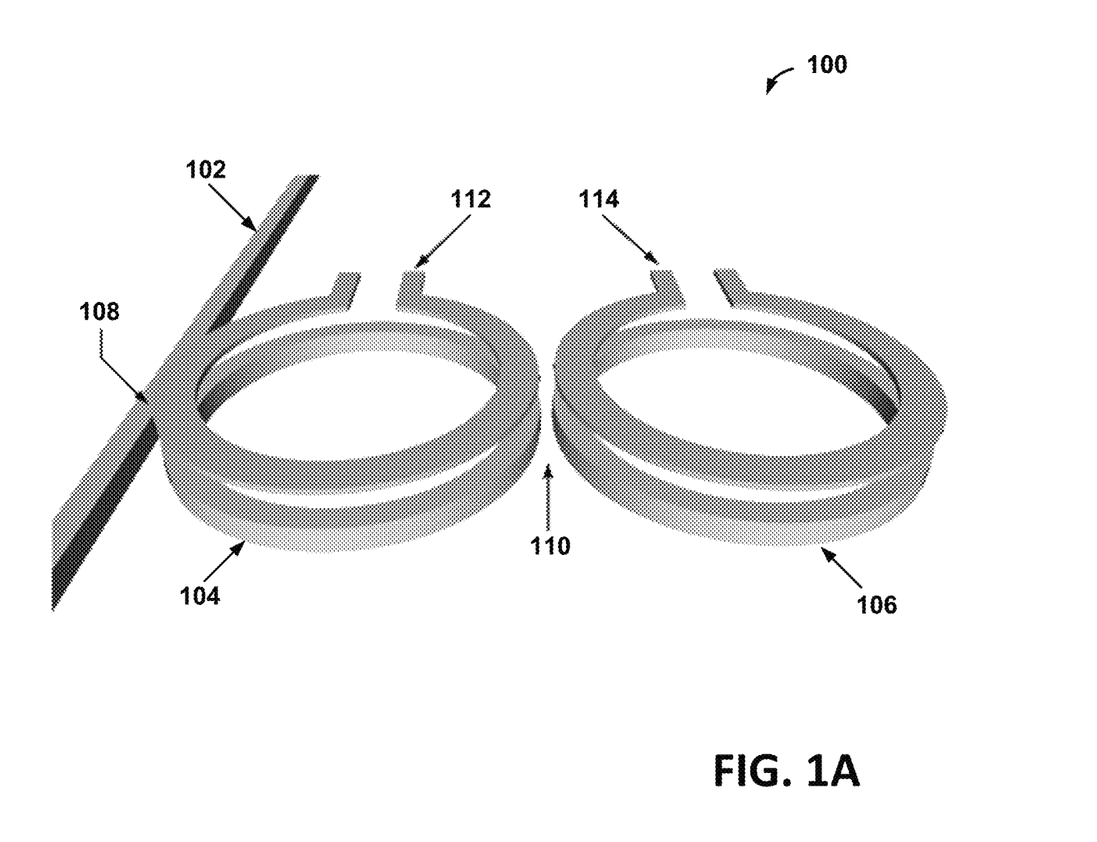
FIG. 1A shows a schematic of dual-ring design for producing tunable mode crossings to produce frequency combs in the normal-GVD regime.

FIG. 1A shows a schematic of an example device in accordance with the present disclosure. The device 100 can comprise a dual-ring configuration that allows tunable mode crossings for generating frequency combs in the normal-GVD regime. The device 100 can be comprised in a wavelength division multiplexing (WDM) system, an optical clock, a molecular spectroscopy device, an astronomical spectrometer, a distance ranging device, a microwave generator device, or a combination thereof.

The device 100 can comprise a waveguide 102. The waveguide 102 can be configured to optically couple to an optical source (e.g., light source). The waveguide 102 can comprise one or more of silicon, silicon nitride, aluminum nitride, lithium niobate, germanium, diamond, silicon carbide, silicon dioxide, glass, amorphous silicon, or silicon-on-sapphire. The waveguide 102 can be optically coupled to an optical source. The optical source can comprise an optical pump source, a laser, a single-frequency continuous-wave pump laser, a hybrid laser, a hybrid SiN laser, or a combination thereof.

The device 100 can comprise at least one optical resonator. The at least one optical resonator can comprise a first optical resonator 104. The at least one optical resonator can comprise a second optical resonator 106. The first optical resonator 104 can comprise a waveguide, a ring-shaped waveguide, a micro-resonator, or a combination thereof. The second optical resonator 106 can comprise a waveguide, a ring-shaped waveguide, a micro-resonator, or a combination thereof. The first optical resonator 104 and the second optical resonator 106 can have the same waveguide spatial mode.

The at least one optical resonator can be optically coupled to the waveguide 102. The first optical resonator 102 can be optically coupled to the waveguide 104 via a first coupling 108. The first coupling 108 can be based on a distance between the first optical resonator 104 and the waveguide 102. The first coupling 108 can be based on a curve length of the first optical resonator 104. The first coupling 108 can be based on a material, a refractive index of the material, and/or the like of one or more of the waveguide 102, the first optical resonator 104, or a gap in between the waveguide 102 and the first optical resonator 104. The first optical resonator 104 and/or the second optical resonator can comprise silicon, silicon nitride, aluminum nitride, lithium niobate, germanium, diamond, silicon carbide, silicon dioxide, glass, amorphous silicon, silicon-on-sapphire, or a combination thereof.

The second optical resonator 106 can be optically coupled to the first optical resonator 104 via a second coupling 110. The second coupling 110 can be based on a distance between the first optical resonator 104 and the second optical resonator 106. The second coupling 110 can be based on a curve length of one or more of the first optical resonator 104 or the second optical resonator 106. The second coupling 110 can be based on a material, a refractive index of the material, and/or the like of one or more of the first optical resonator 104, the second optical resonator 106, or a gap in between the first optical resonator and the second optical resonator 106.

The device 100 can be configured to tune the first coupling 108 and/or the second coupling 110. The first coupling 108 and/or the second coupling 110 may be tuned via thermal tuning. The device 100 may comprise one or more heaters, such as a first heater 112, a second heater 114, or a combination thereof. The first heater 112 can be disposed adjacent (e.g., on top of, below, in contact with) the first optical resonator 104. The first heater 112 can have a shape that at least partially matches (e.g., at least partially ring shaped) a shape of the first optical resonator 104. The second heater 114 can be disposed adjacent (e.g., on top of, below, in contact with) the second optical resonator 106. The second heater 114 can have a shape that at least partially matches (e.g., at least partially ring shaped) a shape of the second optical resonator 106. The first heater 112 can be configured to apply heat to the first optical resonator 104 to tune (e.g., spectrally tune) one or more of the first coupling 108 or the second coupling 110. The second heater 114 can be configured to apply heat to the second optical resonator 106 to tune (e.g., spectrally tune) the second coupling 110.

The first coupling 108 and/or the second coupling 110 can be tuned via electrical tuning. The device 100 can comprise a PIN junction configured to electrically tune (e.g., through use of free-carriers) one or more of the at least one optical resonator. The PIN junction can comprise an indirect bandgap comprising or more silicon, germanium, or a combination thereof. The device 100 can comprise a material (e.g., electro-optic material) configured to electrically tune one or more of the at least one optical resonator. The material can comprise lithium, lithium niobate, lithium tantalate, or a combination thereof.

The first coupling 108 and/or the second coupling can be tuned using one or more Mach-Zehnder interferometer. The one or more Mach-Zehnder interferometer can be configured to perform the tuning of the at least one optical resonator by adjusting a coupling strength of the two different modes, a strength of the first coupling 108, a strength of the second coupling 110, or a combination thereof.

The one or more of the at least one optical resonator can be tuned such that an optical frequency comb is generated. The optical frequency comb can be generated based on mode interaction between two different modes of the at least one optical resonator. The two different modes can comprise two spatial modes (e.g., a first spatial mode of the first optical oscillator 104, a second spatial mode of the second optical oscillator 106), two polarization modes (e.g., a first polarization mode of the first optical oscillator 104, a second polarization mode of the second optical oscillator 106), modes of two different resonators that are optically coupled, or a combination thereof. A coupling strength of the two different modes can be controlled by adjusting a distance of an interaction between two optical resonators of the at least one optical resonator (e.g., the first optical oscillator 104 and the second optical oscillator 106). A wavelength at which the interaction occurs can be tuned by adjusting a spectral position of a resonance.

The optical frequency comb can be generated based on normal group velocity dispersion. A bandwidth of the optical frequency can be controlled by controlling of a coupling strength (e.g., of one or more of the first coupling 108 or the second coupling 110). The optical frequency comb can be generated with channel spacing in a range between range of about 1 GHz to about 1 THz. wherein the optical frequency comb has a number of comb lines in a range of about 10 comb lines to about 100 comb lines, about 100 comb lines to about 200 comb lines, about 100 comb lines to about 500 comb lines, about 100 comb lines to about 1000 comb lines, about 100 comb lines to about 5000 comb lines, about 100 comb lines to about 10,000 comb lines, or a combination thereof.

The first coupling 108 and/or the second coupling 110 can be controlled, tuned, configured, and/or the like based on machine readable instructions, a circuit, a computing device, and/or the like. The first coupling 108 and/or second coupling 110 can be controlled, tuned, configured, and/or the like to control the mode interaction position. A computer implemented method can be implemented to cause the device 100 to control the mode interaction position. The device 100 can be configured to use the method to implement an automated system for comb generation. The device 100 can be configured to control the electrical power supplied to the first heater 112, the second heater 114, or a combination thereof. The electrical power can be increased to locally heat the device 100 (e.g., the first optical resonator 104, the second optical resonator 106) to cause a red-shift of the micro-resonator resonance based on the thermo-optic effect. Due to different tuning rates of the resonance and the degeneracy point, simple pump wavelength tuning or pump power tuning may not provide the control necessary for automated comb generation. The device 100 can be configured to account for the different tuning rates. The device 100 can be configured to cause a blue-shift of the resonance of the first optical resonator 104. The device 100 can be configured to cause a blue-shift of the mode interaction point. The device 100 can be configured to cause a blue-shift to the resonance of the first optical resonator 104 and the mode interaction point while accounting for thermal effects in the coupled-ring.

The device 100 can be configured to cause (e.g., by adjusting the first heater 112, the second heater 114) the mode degeneracy point to occur at a specific wavelength location (e.g., at or near the pump wavelength). A resonance of the first optical resonator 104 can be shifted (e.g., blue-shifted) toward the pump wavelength. Shifting effects of the degeneracy can be accounted for (e.g., by adjusting the first heater 112, the second heater 114). The degeneracy can be shifted to the correct location by the end of the comb generation process. During the comb generation process, the resonance of the second optical resonator 106 can be tuned to shift the degeneracy (e.g., if needed) to facilitate comb generation.

The device 100 can comprise an output coupled to the waveguide 102. The output may comprise an end of the waveguide 102, an optical fiber, a lens, and/or the like. The output may be configured to output the optical frequency comb.

To achieve control over the strength and frequency location of the mode crossing, one can use a coupled-ring geometry based on the Vernier effect. Such a scheme allows control of the strength and spectral position of the mode crossings which enables tuning of the properties (e.g., shape and bandwidth). For stabilization of the combs lines, one can perform active stabilization to stabilize the pump laser to the micro-resonator resonance to allowed for a fixed total comb power. This can be performed by using/sending a small portion of the generated comb to a photodetector referencing the power to a setpoint for controlling the frequency of the pump laser.

To allow for fabrication in a CMOS foundry, one can utilize ultralow-loss coupled ring resonators fabricated in PECVD silicon nitride (SiN), which uses a low-temperature process. A 100-GHz free-spectral range (FSR) comb generator can be optimized for the photonic interconnect system. One exemplary design is a comb with 36 lines spanning a full spectral bandwidth of 50 nm.

Figure 1B:
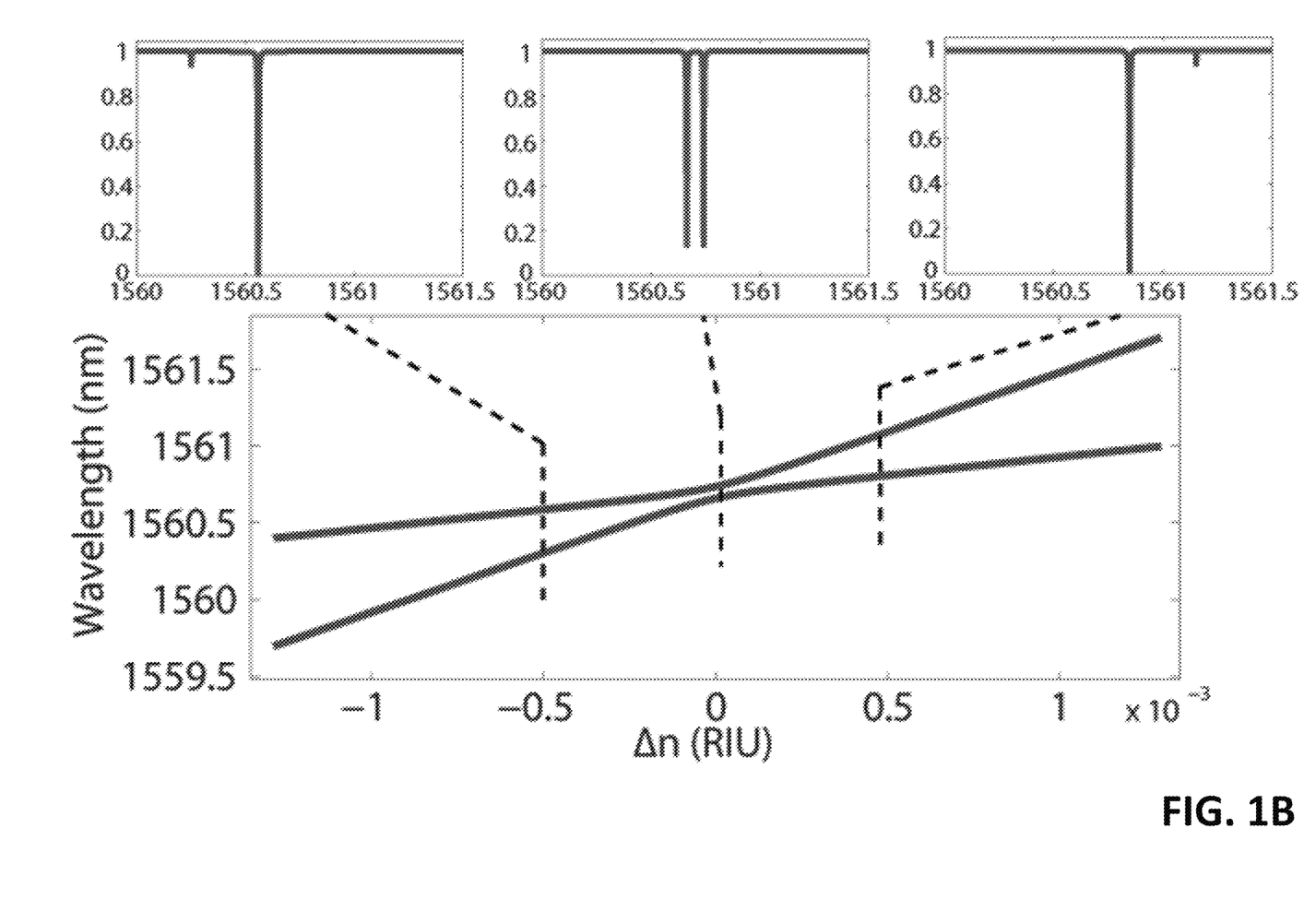
FIG. 1B shows plots illustrating how the mode crossing and mode spectrum is tuned by thermally tuning the refractive index of the second optical resonator.
Figure 1C:
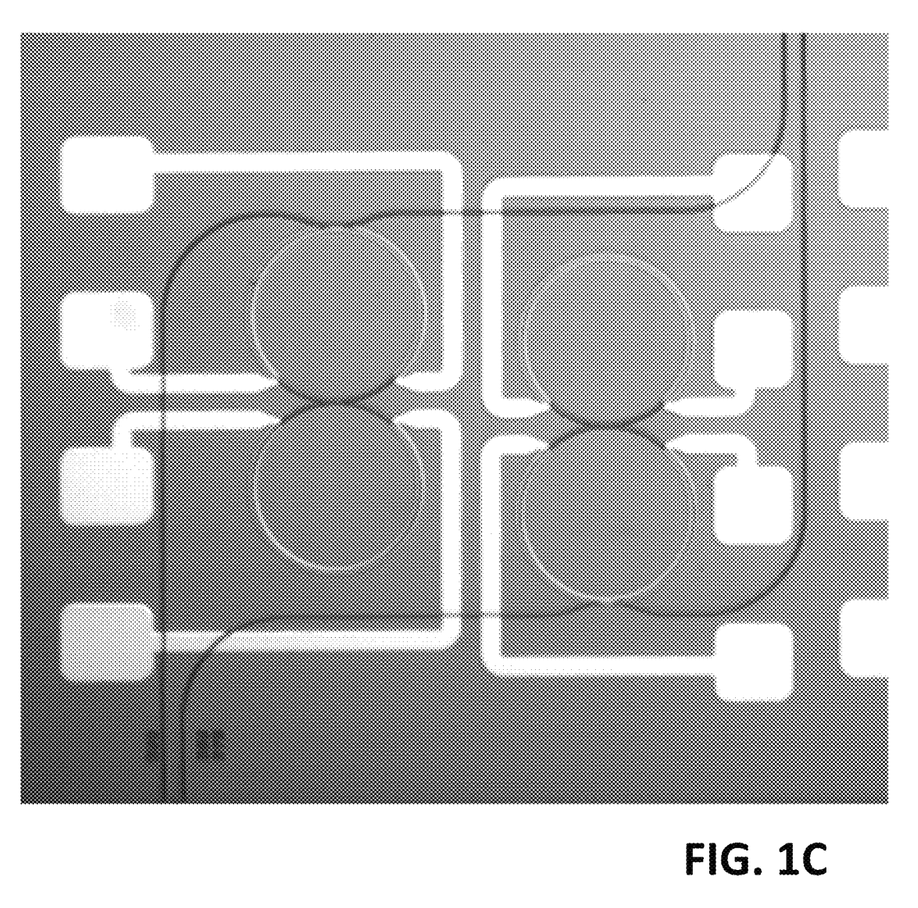
FIG. 1C shows a microscope image of 2 sets of $Si_3N_4$ coupled ring resonators.

FIG. 1B shows plots illustrating how the mode crossing and mode spectrum is tuned by thermally tuning the refractive index of the second optical resonator. FIG. 1C shows a microscope image of 2 sets of $Si_3N_4$ coupled ring resonators.

One can model the dispersion of the PECVD silicon-nitride resonator using a finite element mode solver based on the Sellmeier equations from Pérez, et al. The coupled resonator can have, e.g., a waveguide cross section of 400×1500 nm and an FSR of 100 GHz.

Figure 2A:
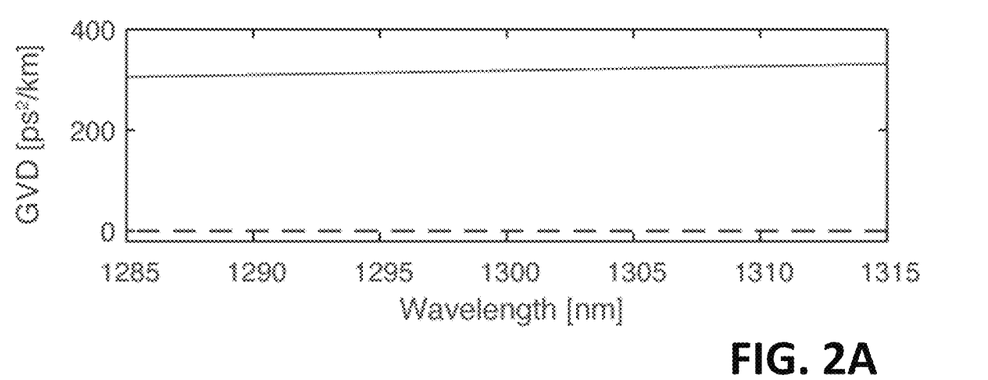
FIG. 2A shows GVD of the silicon nitride resonator with a cross section 400×1500 nm.
Figure 2B:
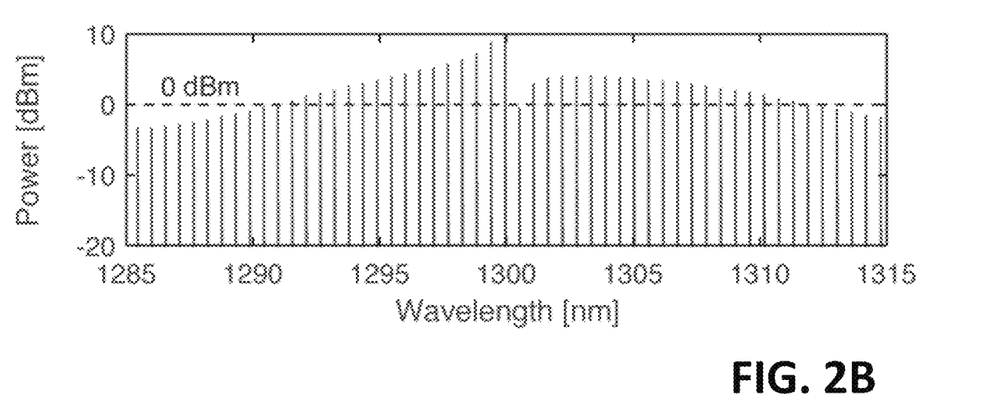
FIG. 2B shows a simulated spectral profile of the comb generated in a coupled resonator.
Figure 2C:
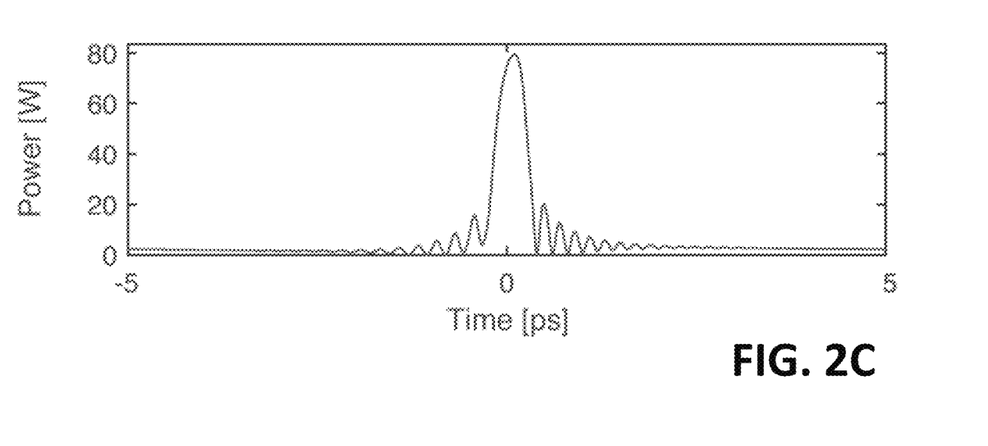
FIG. 2C shows a temporal profile of the comb generated in a coupled resonator.

For modeling comb generation, one can implement mode-crossing effects using a two parameter model as described in Herr, et al. and produce the effective anomalous GVD needed for comb formation over 50 nm of bandwidth by inducing a 6 GHz frequency shift of the resonance at the mode-crossing point to simulate the mode interaction. FIGS. 2A-C shows the simulated GVD and the simulated spectral and temporal profile of the mode-interaction-assisted comb. FIG. 2A shows GVD of the silicon nitride resonator with a cross section 400×1500 nm. FIG. 2B shows a simulated spectral profile of the comb generated in a coupled resonator. FIG. 2C shows a temporal profile of the comb generated in a coupled resonator.

For a pump wavelength of 1300 nm and 200 mW of pump power, one can demonstrate a pump-to-comb conversion efficiency of 42% to 36 comb lines separated by 100 GHz, each with power above 0 dBm. In one simulation, the propagating loss in the resonator is 0.2 dB/cm at 1310 nm, which corresponds to an intrinsic quality (Q) factor of 2.1 million. To achieve efficient comb generation in PECVD nitride, one can characterize the refractive index of the PECVD nitride film to further optimize the dispersion and optimize the coupling strength between the bus waveguide and the ring and between the coupled rings.

For further system efficiency, one can use a SiN hybrid laser (e.g., a hybrid laser previously demonstrated by Columbia University), which laser includes of a III-V reflective semiconductor optical amplifier that is edge coupled to a high Q SiN micro-resonator. Previously, the spectrally narrow reflection from the micro-resonator has allowed for lasing linewidths of 13 kHz. By using the dispersion-engineering nonlinear resonator as the end mirror, one can achieve narrow linewidth lasing and soliton-modelocked comb generation in the device with, e.g., only 98 mW of electrical power. The disclosed technology is applicable to mode-interaction-assisted comb generation for further improvement in power efficiency.

Figure 3:
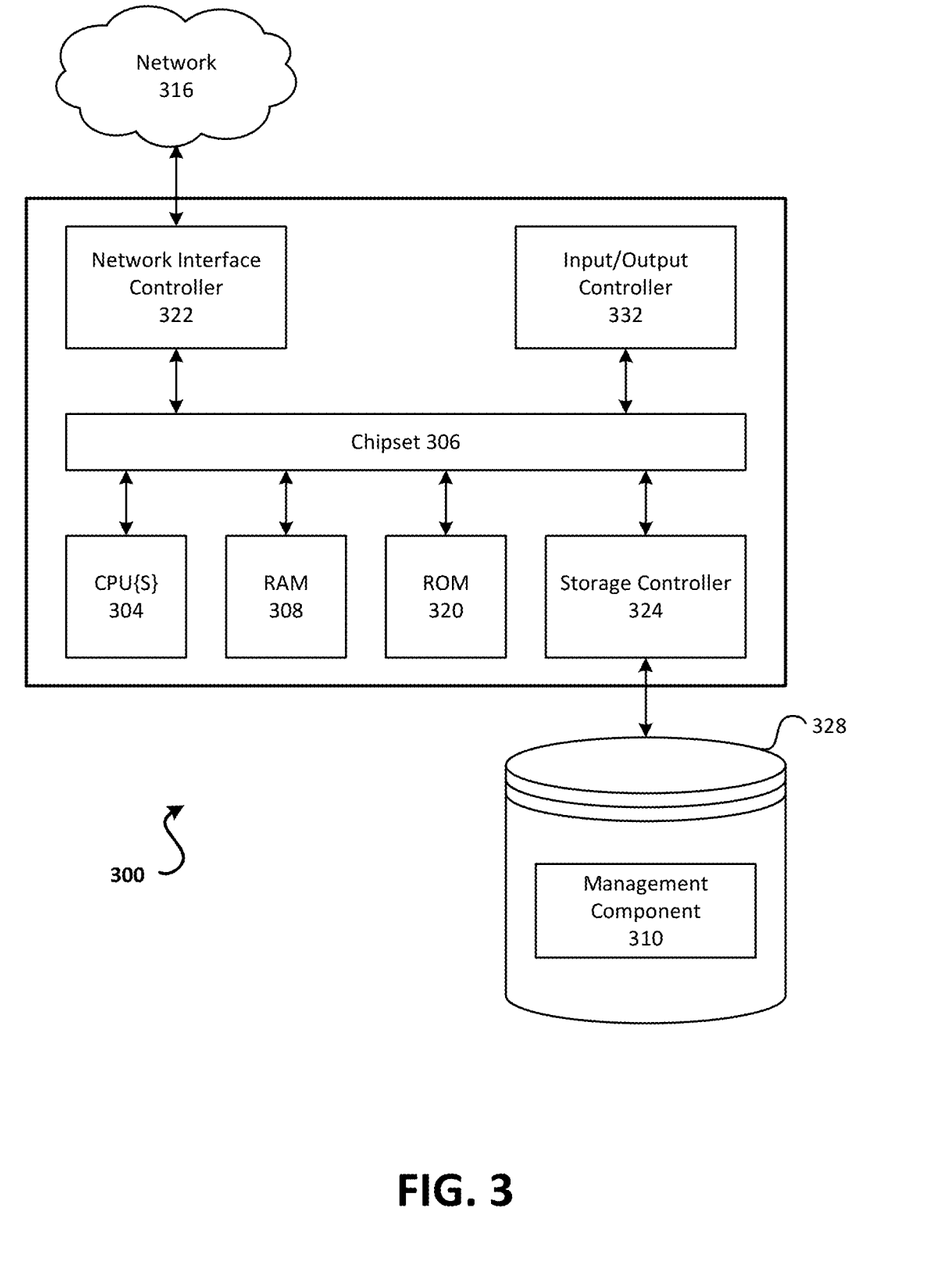
FIG. 3 is a block diagram illustrating an example computing environment for implementing the disclosure.

FIG. 3 depicts a computing device that may be used in various aspects, such as controlling, tuning, modulating, comb generation, and/or the like as described herein. A computing device 300 of FIG. 1 may be electrically coupled to one or more of the components of FIG. 1A, such as the first heater 112, second heater 114, the optical source, and/or the like. The computer architecture shown in FIG. 3 shows a conventional server computer, workstation, desktop computer, laptop, tablet, network appliance, PDA, e-reader, digital cellular phone, or other computing node, and may be utilized to execute any aspects of the computers described herein, such as to implement the methods described herein.

The computing device 300 may include a baseboard, or "motherboard," which is a printed circuit board to which a multitude of components or devices may be connected by way of a system bus or other electrical communication paths. One or more central processing units (CPUs) 304 may operate in conjunction with a chipset 306. The CPU(s) 304 may be standard programmable processors that perform arithmetic and logical operations necessary for the operation of the computing device 300.

The CPU(s) 304 may perform the necessary operations by transitioning from one discrete physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits including registers, adders-subtractors, arithmetic logic units, floating-point units, and the like.

The CPU(s) 304 may be augmented with or replaced by other processing units, such as GPU(s) 305. The GPU(s) 305 may comprise processing units specialized for but not necessarily limited to highly parallel computations, such as graphics and other visualization-related processing.

A chipset 306 may provide an interface between the CPU(s) 304 and the remainder of the components and devices on the baseboard. The chipset 306 may provide an interface to a random access memory (RAM) 308 used as the main memory in the computing device 300. The chipset 306 may further provide an interface to a computer-readable storage medium, such as a read-only memory (ROM) 320 or non-volatile RAM (NVRAM) (not shown), for storing basic routines that may help to start up the computing device 300 and to transfer information between the various components and devices. ROM 320 or NVRAM may also store other software components necessary for the operation of the computing device 300 in accordance with the aspects described herein.

The computing device 300 may operate in a networked environment using logical connections to remote computing nodes and computer systems through local area network (LAN) 316. The chipset 306 may include functionality for providing network connectivity through a network interface controller (NIC) 322, such as a gigabit Ethernet adapter. A NIC 322 may be capable of connecting the computing device 300 to other computing nodes over a network 316. It should be appreciated that multiple NICs 322 may be present in the computing device 300, connecting the computing device to other types of networks and remote computer systems.

The computing device 300 may be connected to a mass storage device 328 that provides non-volatile storage for the computer. The mass storage device 328 may store system programs, application programs, other program modules, and data, which have been described in greater detail herein. The mass storage device 328 may be connected to the computing device 300 through a storage controller 324 connected to the chipset 306. The mass storage device 328 may consist of one or more physical storage units. A storage controller 324 may interface with the physical storage units through a serial attached SCSI (SAS) interface, a serial advanced technology attachment (SATA) interface, a fiber channel (FC) interface, or other type of interface for physically connecting and transferring data between computers and physical storage units.

The computing device 300 may store data on a mass storage device 328 by transforming the physical state of the physical storage units to reflect the information being stored. The specific transformation of a physical state may depend on various factors and on different implementations of this description. Examples of such factors may include, but are not limited to, the technology used to implement the physical storage units and whether the mass storage device 328 is characterized as primary or secondary storage and the like.

For example, the computing device 300 may store information to the mass storage device 328 by issuing instructions through a storage controller 324 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computing device 300 may further read information from the mass storage device 328 by detecting the physical states or characteristics of one or more particular locations within the physical storage units.

In addition to the mass storage device 328 described above, the computing device 300 may have access to other computer-readable storage media to store and retrieve information, such as program modules, data structures, or other data. It should be appreciated by those skilled in the art that computer-readable storage media may be any available media that provides for the storage of non-transitory data and that may be accessed by the computing device 300.

By way of example and not limitation, computer-readable storage media may include volatile and non-volatile, transitory computer-readable storage media and non-transitory computer-readable storage media, and removable and non-removable media implemented in any method or technology. Computer-readable storage media includes, but is not limited to, RAM, ROM, erasable programmable ROM ("EPROM"), electrically erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage, other magnetic storage devices, or any other medium that may be used to store the desired information in a non-transitory fashion.

A mass storage device, such as the mass storage device 328 depicted in FIG. 3, may store an operating system utilized to control the operation of the computing device 300. The operating system may comprise a version of the LINUX operating system. The operating system may comprise a version of the WINDOWS SERVER operating system from the MICROSOFT Corporation. According to further aspects, the operating system may comprise a version of the UNIX operating system. Various mobile phone operating systems, such as IOS and ANDROID, may also be utilized. It should be appreciated that other operating systems may also be utilized. The mass storage device 328 may store other system or application programs and data utilized by the computing device 300.

The mass storage device 328 or other computer-readable storage media may also be encoded with computer-executable instructions, which, when loaded into the computing device 300, transforms the computing device from a general-purpose computing system into a special-purpose computer capable of implementing the aspects described herein. These computer-executable instructions transform the computing device 300 by specifying how the CPU(s) 304 transition between states, as described above. The computing device 300 may have access to computer-readable storage media storing computer-executable instructions, which, when executed by the computing device 300, may perform the methods described herein.

A computing device, such as the computing device 300 depicted in FIG. 3, may also include an input/output controller 332 for receiving and processing input from a number of input devices, such as a keyboard, a mouse, a touchpad, a touch screen, an electronic stylus, or other type of input device. Similarly, an input/output controller 332 may provide output to a display, such as a computer monitor, a flat-panel display, a digital projector, a printer, a plotter, or other type of output device. It will be appreciated that the computing device 300 may not include all of the components shown in FIG. 3, may include other components that are not explicitly shown in FIG. 3, or may utilize an architecture completely different than that shown in FIG. 3.

As described herein, a computing device may be a physical computing device, such as the computing device 300 of FIG. 3. A computing node may also include a virtual machine host process and one or more virtual machine instances. Computer-executable instructions may be executed by the physical hardware of a computing device indirectly through interpretation and/or execution of instructions stored and executed in the context of a virtual machine.

It is to be understood that the methods and systems are not limited to specific methods, specific components, or to particular implementations. It is also to be understood that the terminology used herein is for the purpose of describing particular embodiments only and is not intended to be limiting.

Components are described that may be used to perform the described methods and systems. When combinations, subsets, interactions, groups, etc., of these components are described, it is understood that while specific references to each of the various individual and collective combinations and permutations of these may not be explicitly described, each is specifically contemplated and described herein, for all methods and systems. This applies to all aspects of this application including, but not limited to, operations in described methods. Thus, if there are a variety of additional operations that may be performed it is understood that each of these additional operations may be performed with any specific embodiment or combination of embodiments of the described methods.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described herein with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, may be implemented by computer program instructions. These computer program instructions may be loaded on a general-purpose computer, special-purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

The various features and processes described above may be used independently of one another, or may be combined in various ways. All possible combinations and sub-combinations are intended to fall within the scope of this disclosure. In addition, certain methods or process blocks may be omitted in some implementations. The methods and processes described herein are also not limited to any particular sequence, and the blocks or states relating thereto may be performed in other sequences that are appropriate. For example, described blocks or states may be performed in an order other than that specifically described, or multiple blocks or states may be combined in a single block or state. The example blocks or states may be performed in serial, in parallel, or in some other manner. Blocks or states may be added to or removed from the described example embodiments. The example systems and components described herein may be configured differently than described. For example, elements may be added to, removed from, or rearranged compared to the described example embodiments.

It will also be appreciated that various items are illustrated as being stored in memory or on storage while being used, and that these items or portions thereof may be transferred between memory and other storage devices for purposes of memory management and data integrity. Alternatively, in other embodiments, some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application-specific integrated circuits ("ASICs"), standard integrated circuits, controllers (e.g., by executing appropriate instructions, and including microcontrollers and/or embedded controllers), field-programmable gate arrays ("FPGAs"), complex programmable logic devices ("CPLDs"), etc. Some or all of the modules, systems, and data structures may also be stored (e.g., as software instructions or structured data) on a computer-readable medium, such as a hard disk, a memory, a network, or a portable media article to be read by an appropriate device or via an appropriate connection. The systems, modules, and data structures may also be transmitted as generated data signals (e.g., as part of a carrier wave or other analog or digital propagated signal) on a variety of computer-readable transmission media, including wireless-based and wired/cable-based media, and may take a variety of forms (e.g., as part of a single or multiplexed analog signal, or as multiple discrete digital packets or frames). Such computer program products may also take other forms in other embodiments. Accordingly, the present invention may be practiced with other computer system configurations.

While the methods and systems have been described in connection with preferred embodiments and specific examples, it is not intended that the scope be limited to the particular embodiments set forth, as the embodiments herein are intended in all respects to be illustrative rather than restrictive.

It will be apparent to those skilled in the art that various modifications and variations may be made without departing from the scope or spirit of the present disclosure. Other embodiments will be apparent to those skilled in the art from consideration of the specification and practices described herein. It is intended that the specification and example figures be considered as exemplary only, with a true scope and spirit being indicated by the following claims.

EMBODIMENTS

The following embodiments are illustrative only and do not limit the scope of the present disclosure or the attached claims.

Embodiment 1. A device comprising: a waveguide configured to optically couple to an optical source; at least one optical resonator optically coupled to the waveguide, wherein one or more of the at least one optical resonator is tuned such that an optical frequency comb is generated based on mode interaction between two different modes of the at least one optical resonator; and an output coupled to the waveguide and configured to output the optical frequency comb.

Embodiment 2. The device of Embodiment 1, wherein the two different modes comprise 1) two spatial modes, 2) two polarization modes, 3) modes of two different resonators that are optically coupled, or 4) a combination thereof.

Embodiment 3. The device of any one of Embodiments 1-2, wherein a bandwidth of the optical frequency comb is controlled by controlling of a coupling strength.

Embodiment 4. The device of any one of Embodiments 1-3, wherein the optical frequency comb is generated based on normal group velocity dispersion.

Embodiment 5. The device of any one of Embodiments 1-4, wherein the device has a power conversion efficiency of greater than about 40 percent.

Embodiment 6. The device of any one of Embodiments 1-5, wherein the optical frequency comb has a number of comb lines in a range of about 10 comb lines to about 100 comb lines.

Embodiment 7. The device of any one of Embodiments 1-6, wherein the optical frequency comb has a number of comb lines in a range of: 1) about 100 comb lines to about 200 comb lines, 2) about 100 comb lines to about 500 comb lines, or 3) a combination thereof.

Embodiment 8. The device of any one of Embodiments 1-7, wherein the optical frequency comb has a number of comb lines in a range of 1) about 100 comb lines to about 1000 comb lines, 2) about 100 comb lines to about 5000 comb lines, 3) about 100 comb lines to about 10,000 comb lines, or 4) a combination thereof.

Embodiment 9. The device of any one of Embodiments 1-8, wherein the device is comprised in one or more of an optical clock, molecular spectroscopy device, an astronomical spectrometer, a distance ranging device, or microwave generator device.

Embodiment 10. The device of any one of Embodiments 1-9, wherein the at least one optical resonator comprises at least one micro-resonator.

Embodiment 11. The device of any one of Embodiments 1-10, further comprising one or more heaters configured to spectrally tune one or more of the at least one optical resonator.

Embodiment 12. The device of any one of Embodiments 1-11, wherein a coupling strength of the two different modes is controlled by adjusting a distance of an interaction between two optical resonators of the at least one optical resonator.

Embodiment 13. The device of Embodiment 12, wherein a wavelength at which the interaction occurs is tuned by adjusting a spectral position of a resonance.

Embodiment 14. The device of any one of Embodiments 1-13, further comprising a Mach-Zehnder interferometer configured to perform the tuning of the at least one optical resonator by adjusting a coupling strength of the two different modes.

Embodiment 15. The device of any one of Embodiments 1-14, further comprising a PIN junction configured to electrically tune through free-carriers one or more of the at least one optical resonator, wherein the PIN junction comprises an indirect bandgap comprising or more silicon, germanium, or a combination thereof.

Embodiment 16. The device of any one of Embodiments 1-15, further comprising an electrical tuner comprising an electro-optic material configured to electrically tune one or more of the at least one optical resonator, wherein the electro-optic materials comprise one or more of lithium niobate or lithium tantalate.

Embodiment 17. The device of any one of Embodiments 1-16, wherein one or more of the waveguide or the at least one optical resonator comprise one or more of silicon, silicon nitride, aluminum nitride, lithium niobate, germanium, diamond, silicon carbide, silicon dioxide, glass, amorphous silicon, or silicon-on-sapphire.

Embodiment 18. The device of any one of Embodiments 1-17, wherein the optical frequency comb is generated with channel spacing a range between range of about 1 GHz to about 1 THz.

Embodiment 19. The device of any one of Embodiments 1-18, wherein the device is comprised in a wavelength division multiplexing (WDM) system.

Embodiment 20. The device of any one of Embodiments 1-19, wherein a bandwidth of the optical frequency comb is tune based on 1) a coupling strength between two different optical resonators of the at least one optical resonator, 2) a group velocity dispersion of the at least one optical resonator, or 3) a combination thereof.

Embodiment 21. The device of any one of Embodiments 1-20, wherein the at least one optical resonator comprises at least two optical resonators that have a same waveguide spatial mode.

Embodiment 22. The device of any one of Embodiments 1-21, wherein the at least one optical resonator comprises a first optical resonator and a second optical resonator, wherein the second optical resonator is optically coupled to the first optical resonator.

Embodiment 23. The device of any one of Embodiments 1-21, wherein the at least one optical resonator is tuned to control 1) a spectral position of a resonance of the at least one optical resonator, 2) dispersion of at least one optical resonator, or a combination thereof.

Embodiment 24. The device of any one of Embodiments 1-23, wherein the optical source comprises 1) an optical pump source, 2) a laser, 3) a single-frequency continuous-wave pump laser, or 4) a combination thereof.

Embodiment 25. A method comprising: supplying, from an optical source, an optical signal to at least one optical resonator; tuning the at least one optical resonator to cause output, based on the optical signal, of an optical frequency comb, wherein the optical frequency comb is generated based on mode interaction between two different modes of the at least one optical resonator; and outputting the optical frequency comb.

Embodiment 26. The method of Embodiment 25, wherein the two different modes comprise 1) two spatial modes, 2) two polarization modes, 3) modes of two different resonators that are optically coupled, or 4) a combination thereof.

Embodiment 27. The method of any one of Embodiments 25-26, wherein tuning the at least one optical resonator comprises modifying a coupling strength of one or more of the at least one optical resonator to control a bandwidth of the optical frequency comb.

Embodiment 28. The method of any one of Embodiments 25-27, wherein the optical frequency comb is output based on normal group velocity dispersion.

Embodiment 29. The method of any one of Embodiments 25-28, wherein the optical frequency comb has a number of comb lines in a range of about 10 comb lines to about 100 comb lines.

Embodiment 30. The method of any one of Embodiments 25-29, wherein the optical frequency comb has a number of comb lines in a range of: 1) about 100 comb lines to about 200 comb lines, 2) about 100 comb lines to about 500 comb lines, or 3) a combination thereof.

Embodiment 31. The method of any one of Embodiments 25-30, wherein the optical frequency comb has a number of comb lines in a range of 1) about 100 comb lines to about 1000 comb lines, 2) about 100 comb lines to about 5000 comb lines, 3) about 100 comb lines to about 10,000 comb lines, or 4) a combination thereof.

Embodiment 32. The method of any one of Embodiments 25-31, wherein the at least one optical resonator comprises at least one micro-resonator.

Embodiment 33. The method of any one of Embodiments 25-32, wherein tuning the at least one optical resonator to cause output of the optical frequency comb comprises controlling one or more heaters configured to spectrally tune one or more of the at least one optical resonator.

Embodiment 34. The method of any one of Embodiments 25-33, wherein a coupling strength of the two different modes is controlled by adjusting a distance of an interaction between two optical resonators of the at least one optical resonator.

Embodiment 35. The method of Embodiment 34, wherein tuning the at least one optical resonator to cause output of an optical frequency comb comprises adjusting a spectral position of a resonance of one or more of the at least one optical resonator to tune a wavelength at which the interaction occurs.

Embodiment 36. The method of any one of Embodiments 25-35, wherein tuning the at least one optical resonator to cause output of an optical frequency comb comprises adjusting a coupling strength of the two different modes using a Mach-Zehnder interferometer.

Embodiment 37. The method of any one of Embodiments 25-36, wherein tuning the at least one optical resonator to cause output of an optical frequency comb comprises electrically tuning through free-carriers one or more of the at least one optical resonator using a PIN junction, wherein the PIN junction comprises an indirect bandgap comprising or more silicon, germanium, or a combination thereof.

Embodiment 38. The method of any one of Embodiments 25-37, wherein tuning the at least one optical resonator to cause output of an optical frequency comb comprises electrically tuning one or more of the at least one optical resonator using an electrical tuner comprising an electro-optic material, wherein the electro-optic material comprises one or more of lithium niobate or lithium tantalate.

Embodiment 39. The method of any one of Embodiments 25-38, wherein one or more of the at least one optical resonator comprises one or more of silicon, silicon nitride, aluminum nitride, lithium niobate, germanium, diamond, silicon carbide, silicon dioxide, glass, amorphous silicon, or silicon-on-sapphire.

Embodiment 40. The method of any one of Embodiments 25-39, wherein the optical frequency comb is output with channel spacing a range between range of about 1 GHz to about 1 THz.

Embodiment 41. The method of any one of Embodiments 25-40, performing wavelength division multiplexing with the output optical frequency comb.

Embodiment 42. The method of any one of Embodiments 25-41, wherein tuning the at least one optical resonator to cause output of an optical frequency comb comprises tuning a bandwidth of the optical frequency comb is tuned based on 1) a coupling strength between two different optical resonators of the at least one optical resonator, 2) a group velocity dispersion of the at least one optical resonator, or 3) a combination thereof.

Embodiment 43. The method of any one of Embodiments 25-42, wherein the at least one optical resonator comprises at least two optical resonators that have a same waveguide spatial mode.

Embodiment 44. The method of any one of Embodiments 25-43, wherein the at least one optical resonator comprises a first optical resonator and a second optical resonator, wherein the second optical resonator is optically coupled to the first optical resonator.

Embodiment 45. The method of any one of Embodiments 25-44, wherein tuning the at least one optical resonator to cause output of an optical frequency comb comprises controlling 1) a spectral position of a resonance of the at least one optical resonator, 2) dispersion of at least one optical resonator, or 3) a combination thereof.

Embodiment 46. The method of any one of Embodiments 25-45, wherein the optical source comprises 1) an optical pump source, 2) a laser, 3) a single-frequency continuous-wave pump laser, or 4) a combination thereof.

Embodiment 47. A system comprising a device according to any of one of Embodiments 1-24.

Embodiment 48. A method, comprising operating a device according to any one of Embodiments 1-24 or 47.

REFERENCES

C. Joshi, J. Jang, K. Luke, X. Ji, S. Miller, A. Klenner, Y. Okawachi, M. Lipson, and A. Gaeta, "Thermally controlled comb generation and soliton modelocking in microresonators," Opt. Lett. 41, 2565 (2016).
T. J. Kippenberg, A. L. Gaeta, M. Lipson, M. L. Gorodetsky, "Dissipative Kerr solitons in optical microresonators," Science 361, 567 (2018).
P. Marin-Palomo et al., "Microresonator-based solitons for massively parallel coherent optical communications," Nature 546, 274 (2017).
T. Herr, V. Brasch, J. D. Jost, I. Mirgorodskiy, G. Lihachev, M. L. Gorodetsky, and T. J. Kippenberg, "Mode spectrum and temporal soliton formation in optical microresonators," Phys. Rev. Lett. 113, 123901 (2014).
S. Ramelow, A. Farsi, S. Clemmen, J. S. Levy, A. R. Johnson, Y. Okawachi, M. R. E. Lamont, M. Lipson, and A. L. Gaeta, "Strong polarization mode coupling in microresonators," Opt. Lett. 39, 5134 (2014).
X. Xue, Y. Xuan, Y. Liu, P.-H. Wang, S. Chen, J. Wang, D. E. Leaird, M. Qi, and A. M. Weiner, "Mode-locked dark pulse Kerr combs in normal-dispersion microresonators," Nature Photon. 9, 594 (2015).
J. K. Jang, Y. Okawachi, M. Yu, K. Luke, X. Ji, M. Lipson, and A. L. Gaeta, "Dynamics of mode-crossing-induced microresonator frequency combs in normal dispersion," Opt. Express 24, 28794 (2016).
A. Fülöp, et al., "Higher-order coherent communications using mode-locked dark-pulse Kerr combs from microresonators," Nature Commun. 9, 1598 (2018).
J. C. Hulme, J. K. Doylend, and J. E. Bowers, "Widely tunable Vernier ring laser on hybrid silicon," Opt. Express 21, 19718 (2013).
S. A. Miller, Y. Okawachi, S. Ramelow, K. Luke, A. Dutt, A. Farsi, Alexander L. Gaeta, and M. Lipson, "Tunable frequency combs based on dual microring resonators," Opt. Express 23, 21527 (2015).
X. Xue, Y. Xuan, P.-H. Wang, Y. Liu, D. E. Leaird, M. Qi, and A. M. Weiner, "Normal-dispersion microcombs enabled by controllable mode interactions," Laser Phot. Rev. 9, L23 (2015).
A. Fülöp, et al., "active feedback stabilization of normal-dispersion microresonator combs," in 2017 European Conference on Lasers and Electro-Optics and European Quantum Electronics Conference, (Optical Society of America, 2017), paper CD_P_45.
A. M. Perez, C. Santiago, and F. R. C. Zuñiga, "Optical properties of amorphous hydrogenated silicon nitride thin films," Opt. Eng. 45, 123802 (2006).
T. Herr, V. Brasch, J. D. Jost, I. Mirgorodskiy, G. Lihchev, M. L. Gorodetsky, and T. J. Kippenberg, "Mode spectrum and temporal soliton formation in optical microresonators," Phys. Rev. Lett. 113, 123901 (2014).
B. Stern, X. Ji, A. Dutt, and M. Lipson, "Compact narrow-linewidth integrated laser based on a low-loss silicon nitride ring resonator," Opt. Lett. 42, 4541 (2017).
B. Stern, X. Ji, Y. Okawachi, A. L. Gaeta, and M. Lipson, "Battery-operated integrated frequency comb generator," Nature 562, 401 (2018).

What is claimed:

1. A device, comprising:
  a waveguide configured to optically couple to a single-frequency continuous wave optical source;
  at least one optical resonator optically coupled to the waveguide, wherein one or more of the at least one optical resonator is tuned such that an optical signal supplied to the at least one optical resonator via the waveguide from the single-frequency continuous wave optical source causes generation of an optical frequency comb based on mode interaction between two different modes of the at least one optical resonator; and
  an output coupled to the waveguide and configured to output the optical frequency comb.

2. The device of claim 1, wherein the two different modes comprise (1) two spatial modes, (2) two polarization modes, (3) modes of two different resonators that are optically coupled, or (4) any combination thereof.

3. The device of claim 1, wherein a bandwidth of the optical frequency comb is controlled by controlling of a coupling strength.

4. The device of claim 1, wherein the device is comprised in one or more of an optical clock, molecular spectroscopy device, an astronomical spectrometer, a distance ranging device, or microwave generator device.

5. The device of claim 1, wherein a coupling strength of the two different modes is controlled by adjusting a distance of an interaction between two optical resonators of the at least one optical resonator.

6. The device of claim 5, wherein a wavelength at which the interaction occurs is tuned by adjusting a spectral position of a resonance.

7. The device of claim 1, further comprising a PIN junction configured to electrically tune through free-carriers one or more of the at least one optical resonator, wherein the PIN junction comprises an indirect bandgap comprising or more silicon, germanium, or a combination thereof.

8. The device of claim 1, wherein the device is comprised in a wavelength division multiplexing (WDM) system.

9. The device of claim 1, wherein a bandwidth of the optical frequency comb is tune based on (1) a coupling strength between two different optical resonators of the at least one optical resonator, (2) a group velocity dispersion of the at least one optical resonator, or (3) any combination thereof.

10. The device of claim 1, wherein the at least one optical resonator is tuned to control 1) a spectral position of a resonance of the at least one optical resonator, 2) dispersion of at least one optical resonator, or 3) a combination thereof.

11. A method, comprising:
  supplying, from a single-frequency continuous wave optical source, an optical signal to at least one optical resonator;
  tuning the at least one optical resonator to cause output, based on the optical signal, of an optical frequency comb, wherein the optical frequency comb is generated from the optical signal based on mode interaction between two different modes of the at least one optical resonator; and
  outputting the optical frequency comb.

12. The method of claim 11, wherein the two different modes comprise (1) two spatial modes, (2) two polarization modes, (3) modes of two different resonators that are optically coupled, or (4) any combination thereof.

13. The method of claim 11, wherein tuning the at least one optical resonator comprises modifying a coupling strength of one or more of the at least one optical resonator to control a bandwidth of the optical frequency comb.

14. The method of claim 11, wherein a coupling strength of the two different modes is controlled by adjusting a distance of an interaction between two optical resonators of the at least one optical resonator.

15. The method of claim 14, wherein tuning the at least one optical resonator to cause output of an optical frequency comb comprises adjusting a spectral position of a resonance of one or more of the at least one optical resonator to tune a wavelength at which the interaction occurs.

16. The method of claim 11, wherein tuning the at least one optical resonator to cause output of an optical frequency comb comprises adjusting a coupling strength of the two different modes using a Mach-Zehnder interferometer.

17. The method of claim 11, wherein tuning the at least one optical resonator to cause output of an optical frequency comb comprises electrically tuning through free-carriers one or more of the at least one optical resonator using a PIN junction, wherein the PIN junction comprises an indirect bandgap comprising or more silicon, germanium, or a combination thereof.

18. The method of claim 11, performing wavelength division multiplexing with the output optical frequency comb.

19. The method of claim 11, wherein tuning the at least one optical resonator to cause output of an optical frequency comb comprises tuning a bandwidth of the optical frequency comb is tuned based on (1) a coupling strength between two different optical resonators of the at least one optical resonator, (2) a group velocity dispersion of the at least one optical resonator, or (3) any combination thereof.

20. The method of claim 11, wherein tuning the at least one optical resonator to cause output of an optical frequency comb comprises controlling (1) a spectral position of a resonance of the at least one optical resonator, (2) dispersion of at least one optical resonator, or (3) any combination thereof.

21. The device of claim 1, wherein the device is configured to cause a blue shift to adjust one or more of a mode interaction point or an optical resonance of one or more of the at least one optical resonator to cause one or more of stabilization or modelocking of the optical frequency comb.

22. The device of claim 1, wherein the at least one optical resonator is tuned such that the optical frequency comb is modelocked.

23. The method of claim 11, wherein tuning the at least one optical resonator comprises causing a blue shift to adjust one or more of a mode interaction point or an optical resonance of one or more of the at least one optical resonator to cause one or more of stabilization or modelocking of the optical frequency comb.

24. The method of claim 11, wherein tuning the at least one optical resonator comprises tuning the optical frequency comb to be modelocked.

* * * * *